US005440508A

United States Patent [19]
Pathak et al.

[11] Patent Number: 5,440,508
[45] Date of Patent: Aug. 8, 1995

[54] ZERO POWER HIGH SPEED PROGRAMMABLE CIRCUIT DEVICE ARCHITECTURE

[75] Inventors: Saroj Pathak, Los Altos Hills; James E. Payne, Boulder Creek, both of Calif.

[73] Assignee: Atmel Corporation, San Jose, Calif.

[21] Appl. No.: 194,930

[22] Filed: Feb. 9, 1994

[51] Int. Cl.⁶ .............................................. G11C 14/00
[52] U.S. Cl. ...................................... 365/154; 365/185; 365/228
[58] Field of Search ............... 365/154, 156, 185, 190, 365/228

[56] References Cited

U.S. PATENT DOCUMENTS

| | | | |
|---|---|---|---|
| 4,914,318 | 4/1990 | Allen | 307/272.2 |
| 5,065,362 | 11/1991 | Herdt et al. | 365/154 |
| 5,079,450 | 1/1992 | Win et al. | 307/465 |
| 5,210,448 | 5/1993 | Takata | 307/465.1 |

Primary Examiner—Joseph A. Popek
Attorney, Agent, or Firm—Schneck & McHugh

[57] ABSTRACT

A non-volatile, low, and zero power, high speed self-sensing programmable device and architecture including a non-volatile self-sensing cell. The non-volatile self-sensing cell is connected out of the speed path of the programmable device, permitting rapid, non-volatile programming and reading operations to be conducted. According to one version, two self-sensing cells are provided with a means for selecting one of the cells for programming or read operation. Each non-volatile self-sensing cell includes a latch having cross-coupled, pull-up transistors and non-volatile pull-down cells. The cross-coupled pull-up transistors are field effect transistors having gates which are connected to the opposite sources of the cross-coupled pull-up transistors.

20 Claims, 4 Drawing Sheets

ZERO POWER HIGH SPEED PROGRAMMABLE CIRCUIT DEVICE ARCHITECTURE

TECHNICAL FIELD

The field of the invention is that of non-volatile, low-power programmable semiconductor circuit devices.

BACKGROUND ART

Programmable circuit devices of many kinds are well known. Such programmable circuit devices typically have one or more inputs for receiving information to be stored and processed. The information processing may include performing selected logic operations to produce an output at a selected bitline. The programmable circuit devices may be interconnected as an array having a plurality of input lines and output bitlines. The interconnections which determine the logical functions to be accomplished can either be hard wired ahead of time or determined at a later operating time.

The information which may be subject to logical operation is stored in selected cells which are well known to those skilled in the art. The cells storing information to be processed may be volatile or non-volatile. If the cells are volatile, their state or informational content is subject to irrevocable loss in the event of a power loss or failure. The information in the cells can be sensed or retrieved according to well-known sensing techniques. These well-known techniques unfortunately consume excessive amounts of electric power because of the electric currents required to accomplish the sensing operation.

It is accordingly an object of the invention to develop a circuit architecture for high speed, low or zero power operation which depends upon self-sensing cells able to produce a logical information output without requiring performance of conventional cell sensing operations which consume excessive amounts of electric power.

A further object of the invention is to increase the speed and reduce the power consumption of programmable circuit devices, including but not limited to programmable memories and programmable logic devices and arrays.

It is yet another object of the invention to develop a programmable device which is independent of cell current capabilities.

SUMMARY OF THE INVENTION

The above objects have been achieved in a self-sensing, non-volatile cell architecture according to the invention herein. According to one version of the invention, each self-sensing cell includes a cross-coupled latch having first and second cross-coupled (e.g., p-channel) latch transistors as pull-up devices, and first and second non-volatile pull-down subcells. The non-volatile subcells of the self-sensing cell are used for storing input information provided on an input bitline. The information is particularly stored in each subcell on a floating-gate transistor. If the floating-gate transistor of the pull-down subcell is an n-channel depletion device, the non-volatile subcell additionally includes a pull-down select transistor for connection with a corresponding pull-up transistor of the cross-coupled latch to which the subcell is connected. Otherwise, if the floating gate transistor is a n-channel enhancement device, no such separate pull-down transistor is required in the pull-down subcell.

The non-volatile subcells are connected to the cross-coupled latch transistors at respective first and second connection terminals of the cross-coupled latch. Cross-coupling of the latch transistors is accomplished by connecting the gate of the second cross-coupling transistor to the first connection terminal. Further, the gate of the first cross-coupling transistor is connected to the second connection terminal between the second cross-coupling transistor and the second non-volatile subcell.

The non-volatile self-sensing cells of the invention herein are connected to at least a single bitline for receiving input information or producing output information. The receipt of information by a particular non-volatile cell is referred to as its being programmed. A non-volatile cell may alternatively be connected to two bitlines, for being read by either of them or for being programmed. Alternatively, one bitline can be used for programming and the other to read a particular non-volatile cell. When both bitlines are used to read a particular cell, one bitline can access a particular subcell for its information content, while the other bitline accesses the other subcell. The cross-latching of the pull-up transistors ensures that the subcells will be oppositely programmed. Thus, it is possible to receive a differential output by using two bitlines.

According to another version of the invention, a selected one of a pair of non-volatile self-sensing cells according to the invention is effective for driving the gate of a bitline transistor in turn controlling the state of a selected output bitline. The two non-volatile cells are connected to respective first and second input lines to enable selection of one of the non-volatile cells in the group. When a plurality of groups of such self-sensing cell pairs are connected to a single bitline, an OR gate connection is effectively established.

BEST MODE FOR CARRYING OUT THE INVENTION

Figure 1A:
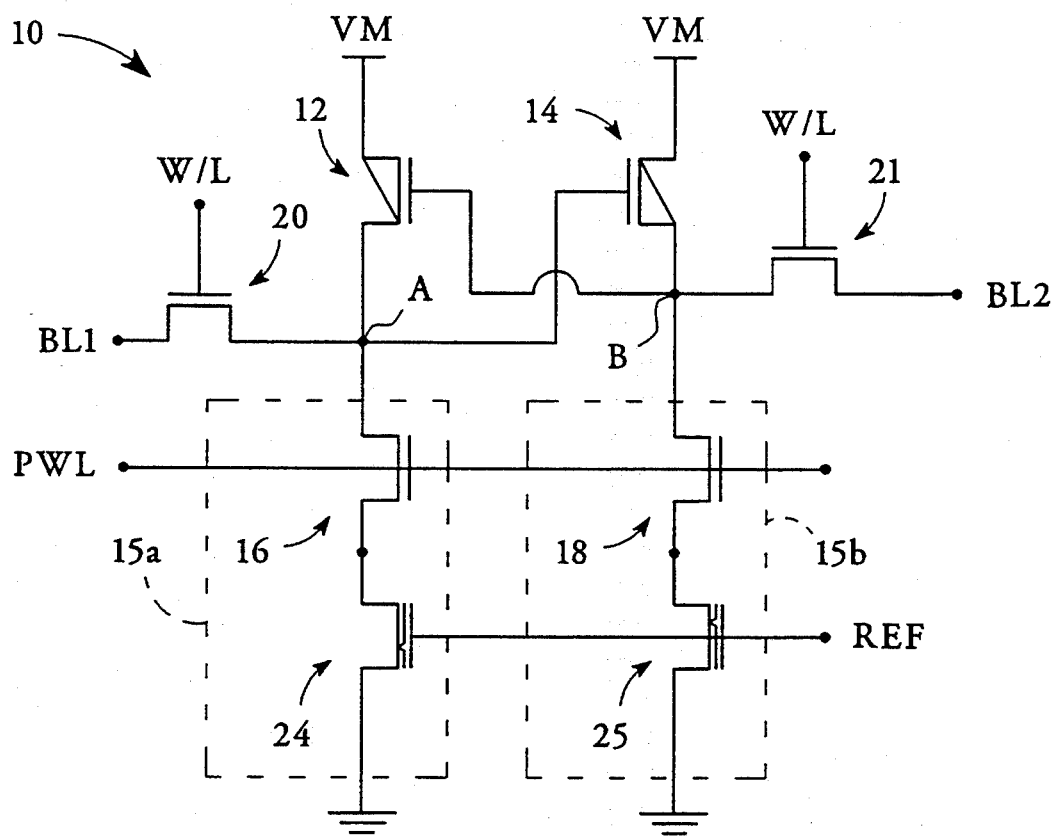
FIG. 1a shows a first version of a non-volatile cell including a cross-coupled latch according to the invention herein.

FIG. 1a shows a self-sensing non-volatile cell 10 according to the invention herein including first and second latch (e.g., p-channel enhancement) pull-up transistors respectively 12 and 14, connected at their respective sources to multiple voltage VM as a supply voltage. VM can be set to a selected voltage, including VCC or a higher level, e.g. VPP, for programming. Pull-up transistors 12 and 14 are cross-coupled as a latch, by electrically connecting their respective control gates to each other's drains at respective terminal nodes A and B, as shown in FIG. 1a. According to the version of the invention shown in FIG. 1a, respective terminal nodes A and B are in turn connected respectively to non-volatile subcells 15a and 15b respectively including (e.g., n-channel enhancement) pull-down transistors 16 and 18. As will be seen with reference to FIG. 1B, terminal nodes A and B can alternatively each be connected directly to a single-transistor cell, without the need for pull-down transistors 16 and 18.

FIG. 1a additionally shows self-sensing non-volatile cell 10 including first and second enhancement transistors 20 and 21 connected respectively to terminal nodes A and B and respective bitlines BL1 and BL2. Enhancement transistors 20 and 21 are clocked by wordline W/L. Non-volatile subcells 15a and 15b each include first and second floating-gate n-channel depletion transistors 24 and 25 respectively connected in series to pull-down transistors 16 and 18. In particular, the drain of floating-gate transistor 24 is connected to the source of pull-down transistor 16. Further, the drain of floating-gate transistor 25 is connected to the source of pull-down transistor 18. The drains of respective pull-down transistors 16 and 18 are respectively connected to terminal nodes A and B. As clocked, non-volatile cell 10 may be read or programmed at respective bitlines BL1 and BL2 at respective terminal nodes A and B.

Non-volatile subcell 15a is programmed by setting wordline W/L and bitline BL1 to voltage level VCC, while bitline BL2 is set to zero. Latching of information from bitline BL1 is accomplished by setting programming wordline PWL to VCC at 5 volts. Once the information from bitline BL1 has been stored in subcell 15a, and particularly in floating-gate transistor 24, supply voltage VM is pumped up to higher voltage level VPP. Programming wordline PWL is also set high to VPP. Accordingly, terminal node A goes to VPP, and terminal node B remains at ground. In summary, according to this programming approach, non-volatile cell 15a is programmed, and the other non-volatile cell 15b is set to a complementary state by action of cross-latched pull-up transistors 12 and 14. Accordingly, when floating-gate transistor 24 is set high, floating gate transistor 25 will be latched low.

Non-volatile subcell 15a can be read by setting programming wordline PWL below VCC and REF at a selected constant voltage level sufficient to permit activation. Access to non-volatile subcell 15a is thus accomplished by setting wordline W/L to 5 volts, enabling data to be read at both bitline BL1 and bitline BL2 to produce a differential output.

Figure 1B:
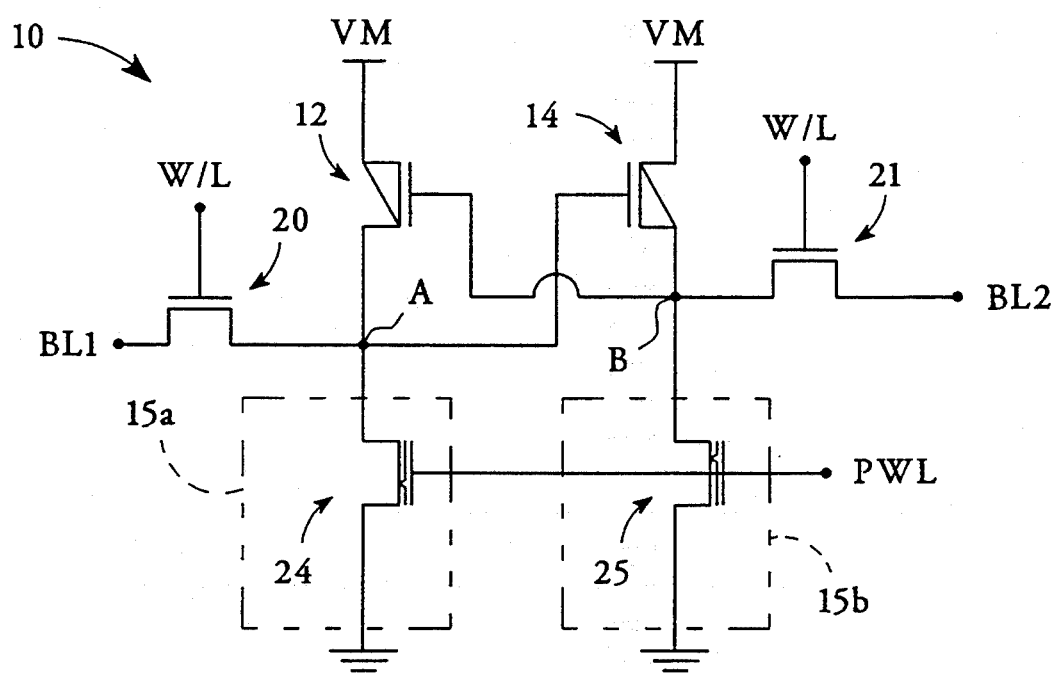
FIG. 1b shows a second version of a non-volatile cell including a cross-coupled latch according to the invention herein.

FIG. 1b shows another version of the invention in which pull-down transistors 16 and 18 are eliminated. This can be done by using n-channel enhancement floating-gate transistors 24 and 25 rather than n-channel depletion transistors. Accordingly, floating-gate transistors 24 and 25 can be driven at their respective gates by programming wordline PWL directly. Otherwise, the circuitry of FIG. 1B and its general operation tracks that of the circuitry in FIG. 1a.

Figure 2:
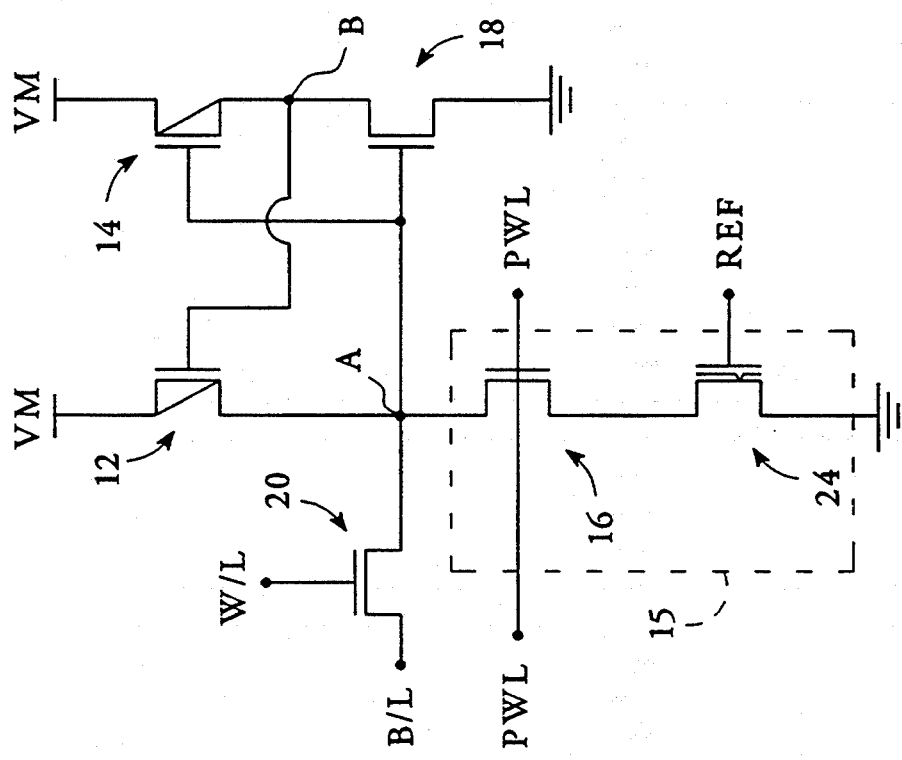
FIG. 2 shows a variation of the non-volatile cell according to the invention herein with a single bitline connection and with a reduced number of transistors.

FIG. 2 shows a variation of non-volatile cell 10 according to the invention herein with a single bit-line B/L connection and with a reduced number of transistors and only a single non-volatile subcell 15 including pull-down transistor 16 and floating-gate transistor 24. In particular, FIG. 2 shows non-volatile cell 10 including first and second p-channel enhancement pull-up transistors respectively 12 and 14, connected at their respective sources to VM. Alternatively, depletion channel transistors may be employed. Pull-up transistors 12 and 14 are cross-coupled as a latch, by electrically connecting their respective control gates to each other's drains at respective terminal nodes A and B. Terminal node A is in turn connected to pull-down transistor 16. Node terminal B is connected to pull-down enhancement transistor 18 at its drain.

FIG. 2 additionally shows non-volatile cell 10 including a single enhancement transistor 20 connected to node A. Non-volatile cell 10 further includes n-channel depletion floating-gate transistor 24 connected to pull-down transistor 16. Further, the drain of floating-gate transistor 24 is connected to the source of pull-down transistor 16, and the drain of pull-down transistor 16 is connected to terminal node A. The control gate of pull-down transistor 18 is additionally connected to terminal node A, and its source is grounded. Enhancement transistor 20 is clocked by wordline W/L. As clocked, non-volatile cell 10 is connected with bitline B/L at node terminal A. Non-volatile subcell 15 is programmable by selecting wordline W/L and bitline B/L to have the value of VCC. Latching of data onto non-volatile subcell 15 from bitline B/L is accomplished by setting programming wordline PWL to VCC at 5 volts. Once the data from B/L has been latched onto pull-down transistor 16, VM is pumped up to VPP. Programming wordline PWL is also set high to VPP. Accordingly, node terminal A goes to VPP. In summary, according to this programming approach, floating gate transistor 24 is programmed. Non-volatile subcell 15 can be read by setting positive wordline PWL below VCC and Ref at a selected constant voltage level. Access to non-volatile subcell 15 is accomplished by setting wordline W/L to 5 volts, enabling data to be read at bitline B/L. The arrangement of FIG. 2 is useful where a differential output along two bitlines is not required.

Figure 3:
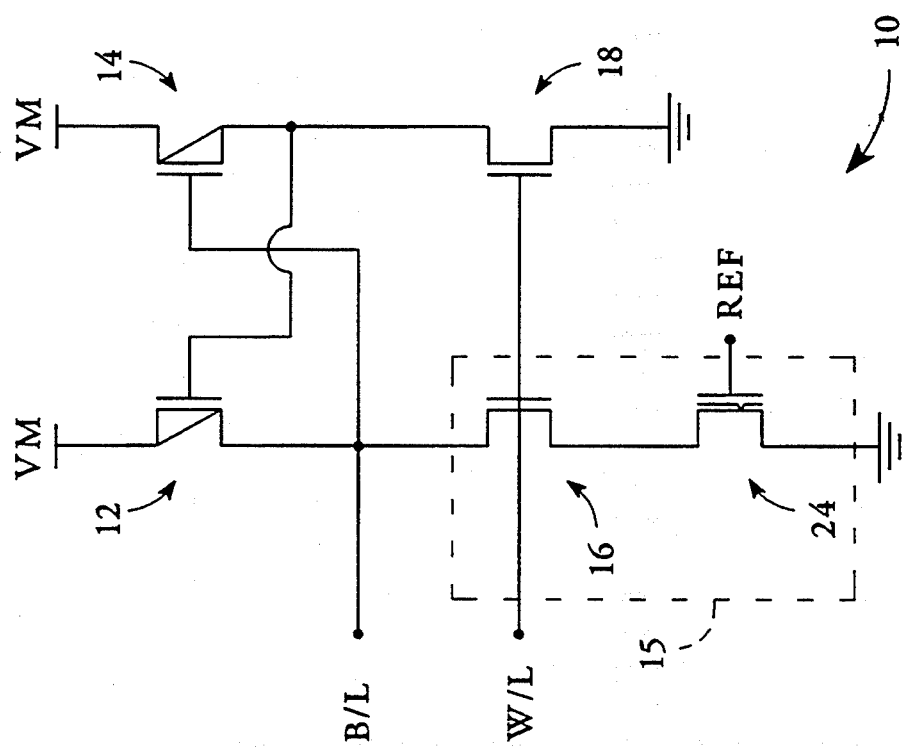
FIG. 3 shows yet another variation of the non-volatile cell according to the invention herein.

FIG. 3 shows a second variation of self-sensing, non-volatile cell 10 according to the invention herein, with a wordline W/L controlling pull-down transistors 16 and 18. Pull-up transistors 12 and 14 remain connected as in FIGS. 1A and 1B, and pull-down transistors 16 and 18 are connected as before to respective pull-up transistors 12 and 14. Additionally, floating-gate transistor 24 is connected to the source of pull-down transistor 16. In this version of non-volatile cell 10, the gates of transistors 16 and 18 are connected and driven by wordline W/L. Pull-down transistor 18 further has its source grounded. Bitline B/L is thus connected to floating-gate transistor 24 for reading and programming in accordance with control signals on wordline W/L.

The version of floating-gate transistor 24 shown is an n-channel depletion transistor. Alternatively, pull-down transistor 16 can be eliminated by using a p-channel enhancement floating-gate transistor 24.

The latching effect of pull-up transistors 12 and 14 permits reduced power reading and programming operations. Power requirements can be further reduced to produce a zero-power arrangement, as shown in FIG. 2, by shutting off transistor 14 when transistor 12 is on (and vice-versa), by connecting the control gates of pull-up transistor 14 and pull-down transistor 18.

Figure 4:
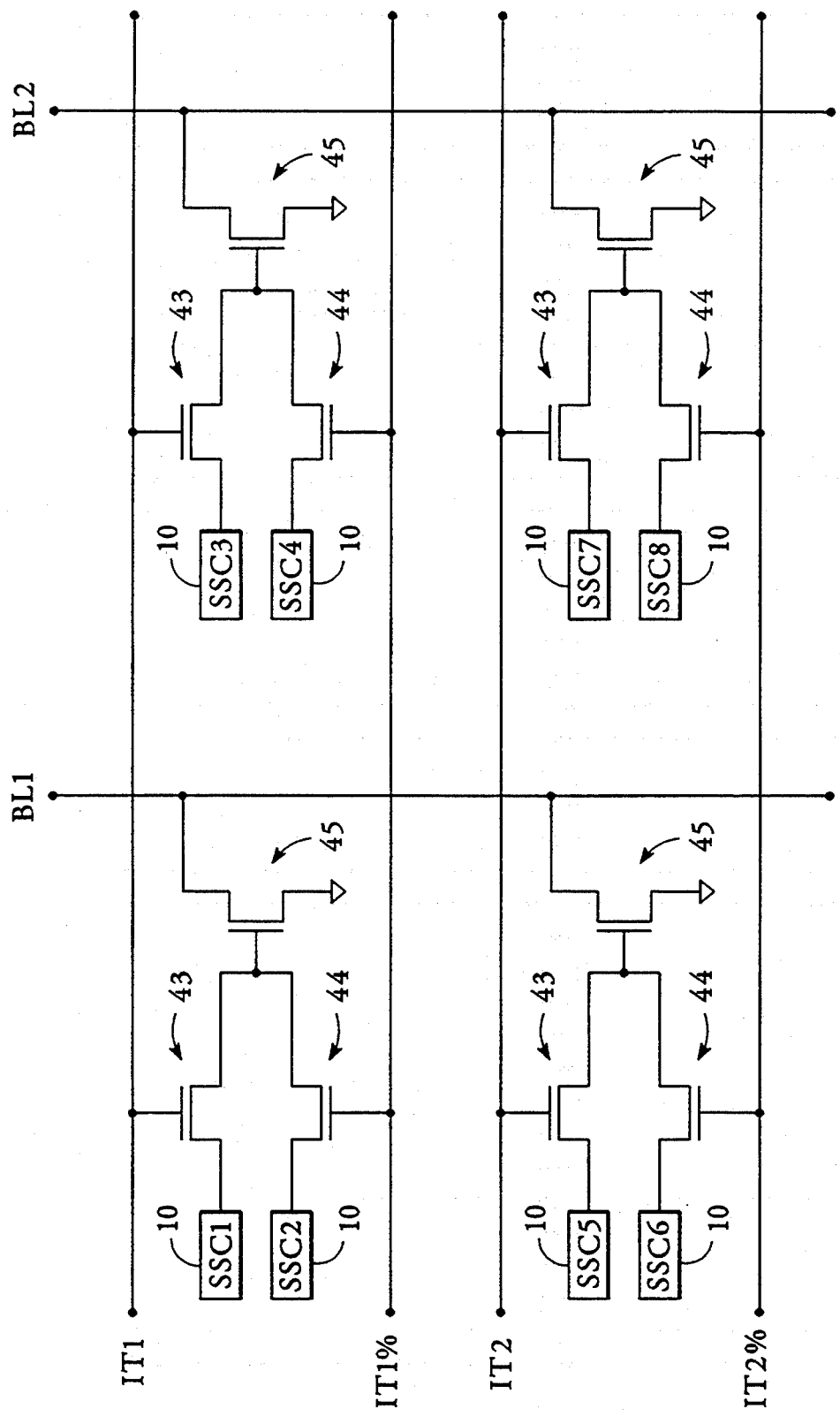
FIG. 4 shows a multicell arrangement of non-volatile cells according to the invention herein.

FIG. 4 shows a non-volatile multicell arrangement 40 of eight non-volatile self-sensing cells 10 according to the invention herein. Multicell arrangement 40 is either zero power or low power depending upon whether or not exclusively zero power cells are employed. Non-volatile cells 10 are paired or multiplexed and only one of self-sensing cells SSC1 and SSC2 is selected at any given time. Additional pairs of multiplexed cells include SSC3 and SSC4; SSC5 and SSC6; and SSC7 and SSC8. Multicell arrangement 40 shown in FIG. 4 includes four such paired groupings of cells 10. Each grouping of multiplexed SSC cells further includes a pair of input lines associated with a single bitline BL. Only one of these two input lines is asserted at any given time, to make a selection of one set of two paired cells 10. The first grouping of cells 10 in multicell arrangement 40 includes, for example, input lines, IT1 and IT1%, bitline BL1, first and second self-sensing non-volatile cells 10, SSC1 and SSC2, first and second input line selection transistors 43 and 44, and bitline transistor 45.

Accordingly, the eight cell arrangement of FIG. 4 provides for two pairs of input lines for selecting which one of each pair of cells 10 is to be asserted at any given time, and two output bitlines BL1 and BL2. The input lines include IT1, IT1%, IT2, and IT2%. IT1 and IT1% form a first pair of input lines which carry complementary signals to ensure that only one of input line selection transistors 43 and 44 is selected at any given time. IT2 and IT2% form a second pair of input lines effective for controlling the selection of a self-sensing cell 10 from another paired group. When IT1 is high, the data from SSC1 will turn transistor 45 in its grouping on or off depending on the logical state of cell SSC1. In the arrangement 40 shown in FIG. 4, the product terms on bitlines BL1 and BL2 may accordingly implement first and second logical OR functions based upon the input terms produced from two cells 10 controlled by the selection of input line pairs IT1 and IT1%, and IT2 and IT2%. Alternatively, arrangement 40 can be connected as part of a CMOS logic array of zero-power logic gates, the gates including AND, NAND, OR, NOR, XOR, XNOR, XAND, XNAND, or other kinds of gates, including complex gate arrangements. Bitline 45 are preferably high-speed single-poly transistors to maximize speed. Self-sensing cells SSC1-SSC8 are disconnected from the speed path of multicell arrangement 40, even though cells 10 do determine the logical states of respective transistors 45.

Figure 5:
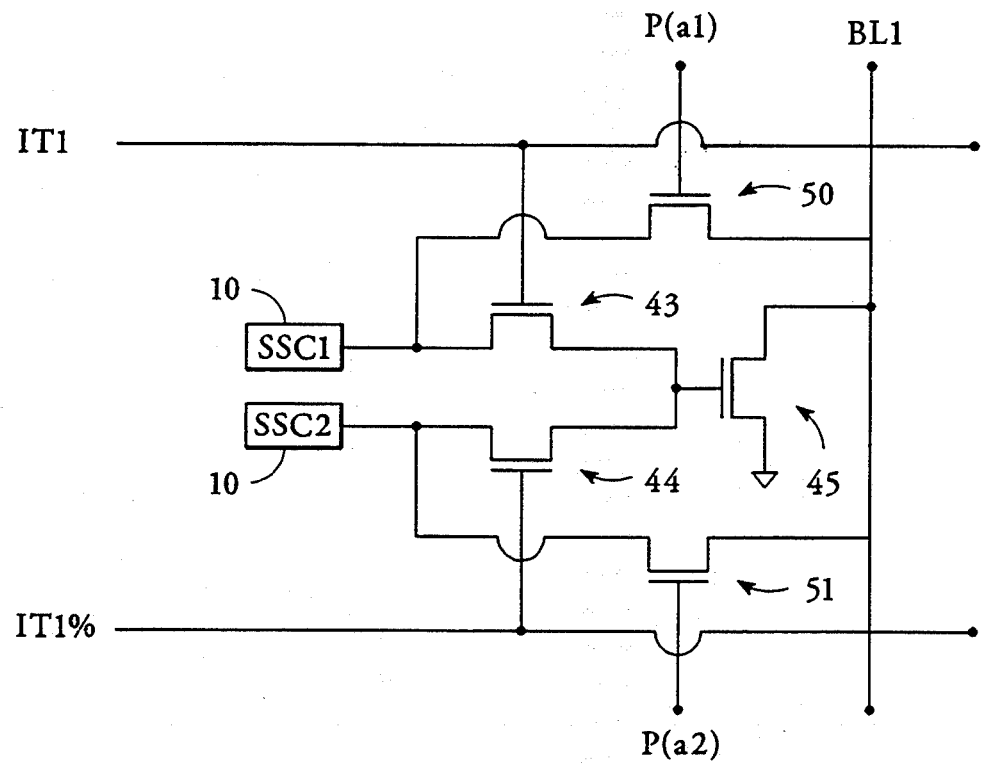
FIG. 5 shows the arrangement of FIG. 4 further including transistors for enabling the programming of selected cells of the invention.
Figure 6:
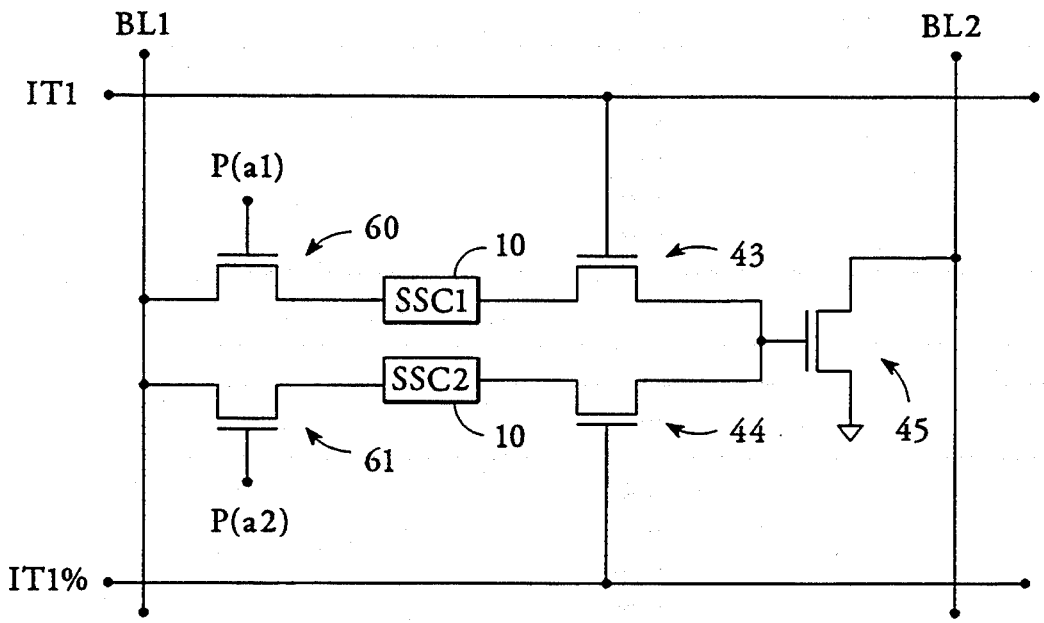
FIG. 6 shows a variation of the arrangement of FIG. 5 which permits programming of selected cells of the programmable circuit device of the invention.

FIG. 5 shows the arrangement of FIG. 4 further including programming transistors 50 and 51 for enabling the programming of selected self-sensing cells 10 in multicell arrangement 40. For example, transistor 50 is connected to self-sensing cell SSC1 to enable communication between bitline BL1 and self-sensing cell SSC1 under gate control of an input programming signal P(a1). Similarly, transistor 51 is connected to self-sensing cell SSC2 to enable communication between bitline BL1 and self-sensing cell SSC2 under gate control of a second input programming signal P(a2), which controls transistor 44 at its control gate. FIG. 6 shows yet another variation of the arrangement of FIG. 4 which permits programming of selected self-sensing cells 10 of multicell arrangement 40 of the invention. In this case, transistors 60 and 61 are connected to bitline BL1 for programming under control of respective gate programming signals P(a1) and P(a2), while read operations are conducted with reference to bitline BL2 through input line selection transistors 43 and 44, and bitline transistor 45.

In summary, according to the arrangement of the invention, high speed programming and read operations are accomplished at zero power consumption with programmable circuit devices having non-volatile, self- sensing cells which rely upon cross-coupled pull-up latch transistors connected to non-volatile pull-down subcells. Zero-power consumption is passed upon zero DC power conditions and the absence of DC currents in applicable cells or subcells. The overall circuitry in which the zero power cells or subcells are connected may nonetheless be at low power, allowing for some DC current. The self-sensing cells 10 described herein are considered to be self-sensing in that no sense amplifiers are required for communication of information as to the memory states of the cells. Instead, the self-sensing cells 10 are able to provide a direct logical output for the bitline.

We claim:
1. A non-volatile programmable circuit comprising:
   (a) latch means for controlling the application of bitline information, said latch means including first, second, third and fourth terminals,
   (b) first and second non-volatile cells, each having a first terminal respectively connected to said first and second terminals of said latch means, said first and second non-volatile cells each having a second terminal connected to a reference potential,
   (c) first and second means for respectively selectively connecting said first and second terminals of said latch means to first and second bit lines, whereby bitline information can be communicated and secured in said first and second non-volatile cells, and
   (d) a voltage terminal means for providing a plurality of selectable voltage levels relative to said reference potential, said plurality of selectable voltage levels having values other than zero, said third and fourth terminals of said latch means having an electrical connection to said voltage terminal means,
   said latch means including first and second transistors, said transistors each having first terminals, second terminals and a control gate, said first terminals of said first and second transistors being coupled respectively to said first and second terminals of said latch means, said control gates being cross coupled to said first terminals of said first and second transistors, said second terminals of said first and second transistors being coupled respectively to said third and fourth terminals of said latch means.

2. The non-volatile programmable circuit according to claim 1, wherein said first and second transistors of said latch means are p-channel field effect devices.

3. The non-volatile programmable circuit according to claim 1, wherein said first and second non-volatile cells include n-channel transistors.

4. The non-volatile programmable circuit according to claim 1, wherein said first and second means for respectively selectively connecting include respective first and second gate-driven transistors which are effective for connecting said first and second terminals to corresponding first and second bitlines in response to gate signals applied to said first and second gate-driven transistors.

5. The non-volatile programmable circuit according to claim 1, wherein said first and second non-volatile cells include field effect transistors in turn including control gate terminals, and the control gate terminals are connected for receipt of a common control signal.

6. The non-volatile programmable circuit according to claim 1, wherein said first and second non-volatile cells include respective first and second floating-gate transistors.

7. The non-volatile programmable circuit according to claim 1, wherein said non-volatile programmable circuit is implemented as an array of zero-power logic gates.

8. A non-volatile programmable logic circuit comprising:
(a) first and second latch transistors having respectively a first terminal and a second terminal, said first and second terminals being connected to a voltage source,
(b) first and second non-volatile pull-down cells respectively connected to said first and second latch transistors, said first and second latch transistors respectively including third and fourth terminals to which said first and second non-volatile cells are respectively electrically connected, said first and second latch transistors being field effect transistors and each having a control gate, said control gates of said first and second latch transistors being connected respectively to said fourth and third terminals, and said second non-volatile pull-down cell being connected to ground, and
(c) means for selectively connecting said third terminal to an input bitline, whereby bitline information can be communicated and secured in said first non-volatile pull-down cell.

9. The non-volatile programmable logic circuit according to claim 8, wherein said first and second latch transistors are p-channel devices.

10. The non-volatile programmable logic circuit according to claim 8, wherein said first and second non-volatile pull-down cells each include in series a select transistor and a floating-gate transistor.

11. The non-volatile programmable logic circuit according to claim 8, wherein said means for selectively connecting said third terminal includes a gate driven transistor effective for connecting said third terminal to a bitline in response to a gate signal applied to said gate driven transistor.

12. The non-volatile programmable logic circuit according to claim 8, wherein said second non-volatile pull-down cell is a field effect transistor including a control gate terminal, and the control gate terminal is connected to said third terminal, whereby the power requirements of said logic circuit are reduced.

13. The non-volatile programmable logic circuit according to claim 8, wherein said non-volatile programmable logic circuit is implemented as an array of zero-power logic gates.

14. A non-volatile programmable circuit comprising:
(a) first and second non-volatile cell means for storing logical information, said first and second non-volatile cell means respectively including first and second non-volatile pull-down transistors being respectively connected to first and second latch transistors, said first and second latch transistors respectively including first and second terminals to which said first and second non-volatile pull-down transistors are respectively electrically connected, said first and second latch transistors each having a control gate, and the control gates of said first and second latch transistors being connected respectively to said second and first terminals, said first and second latch transistors having third and fourth terminals, said third and fourth terminals being connected to a voltage source,
(b) bitline transistor means for connecting said first and second non-volatile cell means to a single sensing bitline, said bitline transistor means including a control gate connected to both said first and second non-volatile cell means, and
(c) selection means for interruptably connecting the control gate of the bitline transistor means and said respective first and second non-volatile cell means, said selection means being effective for selecting one of said first and second non-volatile cell means for communication with the control gate of the bitline transistor means.

15. A non-volatile programmable circuit, comprising:
(a) first and second non-volatile self-sensing programmable cell means for storing and communicating information,
(b) a single bitline means for receiving information from said first and second non-volatile self-sensing programmable cell means,
(c) selection means for selecting one of said first and second non-volatile self-sensing programmable cell means, and
(d) switch means for sensing information stored in one of said first and second non-volatile self-sensing programmable cell means, said switch means including first and second terminals and a control gate, said control gate being connected to said selection means and said single bitline means being connected to said first terminal, the selected one of said first and second non-volatile self-sensing programmable cell means being sensed by said single bitline means.

16. The non-volatile programmable circuit of claim 15, further comprising means for programming said first and second non-volatile cell means.

17. The non-volatile programmable circuit of claim 16, wherein said means for programming is connected to said bitline means.

18. The non-volatile programmable circuit of claim 15, further comprising a second bitline means for communicating information to said first and second non-volatile self-sensing programmable cell means.

19. The non-volatile programmable circuit of claim 18, wherein said first and second non-volatile self-sensing programmable cell means are programmed from said second bitline means via a means for programming connected to said second bitline means.

20. The non-volatile programmable circuit of claim 15, wherein said non-volatile programmable circuit is implemented as an array of zero-power logic gates.

* * * * *